United States Patent
Steyer et al.

(10) Patent No.: US 9,691,269 B2
(45) Date of Patent: Jun. 27, 2017

(54) MULTIPLE FUNCTION ARRANGEMENT FOR ELECTRONIC APPARATUS AND METHOD THEREOF

(71) Applicant: THOMSON LICENSING, Issy de Moulineaux (FR)

(72) Inventors: Jean-Marie Steyer, Chateaubourg (FR); Gerard Morizot, Voiron (FR)

(73) Assignee: Thomson Licensing (FR)

( * ) Notice: Subject to any disclaimer, the term of this patent is extended or adjusted under 35 U.S.C. 154(b) by 0 days.

(21) Appl. No.: 14/432,792

(22) PCT Filed: Sep. 30, 2013

(86) PCT No.: PCT/EP2013/070366
§ 371 (c)(1),
(2) Date: Apr. 1, 2015

(87) PCT Pub. No.: WO2014/053447
PCT Pub. Date: Apr. 10, 2014

(65) Prior Publication Data
US 2015/0254974 A1    Sep. 10, 2015

(30) Foreign Application Priority Data
Oct. 2, 2012   (EP) .................................... 12306199

(51) Int. Cl.
*G08C 19/16*    (2006.01)
*G08C 17/02*    (2006.01)
(Continued)

(52) U.S. Cl.
CPC ........... *G08C 17/02* (2013.01); *H03K 17/941* (2013.01); *H03K 17/9631* (2013.01);
(Continued)

(58) Field of Classification Search
CPC ............... H03K 17/941; H03K 17/943; H03K 17/9629; H03K 17/9631; H03K 17/9636;
(Continued)

(56) References Cited

U.S. PATENT DOCUMENTS 4,878,107 A * 10/1989 Hopper ................ H03K 17/941
220/2.1 R
5,103,085 A * 4/1992 Zimmerman ........... G01S 17/06
250/214 B
(Continued)

FOREIGN PATENT DOCUMENTS

EP   1349279   10/2003
EP   1383242   1/2004
(Continued)

OTHER PUBLICATIONS

Chen etal: "Polymer Infrared Proximity Sensor Array", IEEE Transactions on Electron Devices, IEEE Service Center, vol. 58, No. 4, Apr. 1, 2011, pp. 1215-1220.
(Continued)

*Primary Examiner* — Firmin Backer
*Assistant Examiner* — Adnan Aziz
(74) *Attorney, Agent, or Firm* — Jack Schwartz & Associates, PLLC

(57) ABSTRACT

The current invention relates to the reuse of elements in an device to provide multiple functions of function indication, remote control command reception and touch sensor. The device comprises an indicator element providing a first function of indicating to a user the operating state of the said device, a receiver element providing a second function of reception of remote control commands from a remote control device, means for combining the indicator element and the receiver element to provide a third function of touch sensor. The indicator element provides the first function (Continued)

during a subsequent second period of time and the receiver element providing the second function during the second of the time, the first and the second period of time being continuously alternated.

13 Claims, 7 Drawing Sheets

(51) Int. Cl.
*H03K 17/94* (2006.01)
*H03K 17/96* (2006.01)
*G01S 7/497* (2006.01)
*G01S 7/02* (2006.01)

(52) U.S. Cl.
CPC .............. *G01S 7/026* (2013.01); *G01S 7/497* (2013.01); *G08C 2201/30* (2013.01); *G08C 2201/50* (2013.01); *H03K 2217/96042* (2013.01)

(58) Field of Classification Search
CPC .......... H03K 2217/94106; H03K 2217/94108; H03K 2217/94116; G01S 7/026; G01S 7/497; G01S 7/4815
See application file for complete search history.

(56) References Cited

U.S. PATENT DOCUMENTS

| | | | | |
|---|---|---|---|---|
| 6,107,938 A * | 8/2000 | Du | ...................... | H03K 17/941 307/117 |
| 6,535,694 B2 * | 3/2003 | Engle | .................... | G03B 17/38 250/221 |
| 7,486,386 B1 * | 2/2009 | Holcombe | ............... | G01C 3/08 356/4.01 |
| 7,714,265 B2 * | 5/2010 | Fadell | .................... | G01J 1/4204 250/201.1 |
| 7,795,584 B2 * | 9/2010 | Mok | ....................... | A47K 10/36 225/10 |
| 7,907,061 B2 * | 3/2011 | Lin | ....................... | G06F 1/3203 340/686.6 |
| 7,960,807 B2 * | 6/2011 | Lin | ....................... | G01J 1/4204 250/214 AL |
| 8,487,256 B2 * | 7/2013 | Kwong | ................. | G01S 17/026 250/338.1 |
| 8,604,436 B1 * | 12/2013 | Patel et al. | ................ | H03J 9/06 348/734 |
| 8,805,302 B2 * | 8/2014 | Pantfoerder | ......... | H03K 17/941 250/338.1 |
| 8,873,026 B2 * | 10/2014 | Puig | ...................... | G01J 1/0214 455/575.8 |
| 8,946,620 B2 * | 2/2015 | Loong et al. | ........... | G01S 17/02 356/3.01 |
| 2002/0002080 A1 | 1/2002 | Stockdale | | |
| 2002/0020808 A1 | 2/2002 | Kado | | |
| 2007/0194217 A1 * | 8/2007 | Takiba | ...................... | G01J 1/32 250/226 |
| 2008/0219672 A1 * | 9/2008 | Tam et al. | ............. | G01J 1/4204 250/201.1 |
| 2010/0060611 A1 | 3/2010 | Nie | | |
| 2010/0295773 A1 * | 11/2010 | Alameh | ............. | H03K 17/9631 345/156 |
| 2010/0321152 A1 | 12/2010 | Argudyaev et al. | | |
| 2011/0042556 A1 * | 2/2011 | Natsuaki | .................. | G01J 1/44 250/226 |
| 2011/0057129 A1 * | 3/2011 | Yao et al. | ............. | G06F 1/3203 340/686.6 |
| 2011/0086676 A1 | 4/2011 | Choi et al. | | |
| 2011/0121182 A1 * | 5/2011 | Wong | .................... | G01S 7/4813 250/340 |
| 2012/0050189 A1 * | 3/2012 | Choboter et al. | ..... | G01S 7/4813 250/552 |
| 2012/0145932 A1 * | 6/2012 | Yao et al. | ......... | H04M 1/72577 345/173 |
| 2013/0107129 A1 * | 5/2013 | Britt, Jr. | ............... | H03K 17/941 250/578.1 |

FOREIGN PATENT DOCUMENTS

| | | |
|---|---|---|
| JP | 61198691 | 9/1986 |
| KR | 963228 | 6/2010 |
| WO | WO2011121364 | 10/2011 |

OTHER PUBLICATIONS

Search Report Dated Nov. 7, 2013.

* cited by examiner

MULTIPLE FUNCTION ARRANGEMENT FOR ELECTRONIC APPARATUS AND METHOD THEREOF

This application claims the benefit, under 35 U.S.C. §365 of International Application PCT/EP2013/070366, filed Sep. 30, 2013, which was published in accordance with PCT Article 21(2) on Apr. 10, 2014 in English and which claims the benefit of European patent application No. 12306199.6, filed Oct. 2, 2012.

1. Field of Invention

The present invention generally relates to user interfaces for electronic devices, and more specifically to touch sensing for triggering a state change of an touch-sensitive switch.

2. Technical Background

Switch actuators are traditionally based on conventional mechanical controls. Such mechanical actuators are vulnerable to adverse environmental conditions such as moisture condensation and low temperatures. Besides these mechanical switch actuators, touch switch actuators are used that are based on capacitive or optoelectric sensors. These offer new housing design possibilities, simple fabrication, low assembly cost, mechanical reliability and comfort of operation under various environmental conditions. Capacitive touch switch actuators need the presence of a receptive surface or button, which reduces design choices of the housing, which receives the switch actuator; when designing a housing of a device, placements must be foreseen for these capacitive switch buttons. This makes cost reduction difficult when designing housings for multiple variants of a same apparatus. Switching elements based on optoelectric sensors allow increased design flexibility, as they can be placed behind a semitransparent surface, for example the surface that is put in front of a display. Absence or presence of the optoelectric switch is then simply indicated by absence or presence of a visible marking on the semitransparent surface. With switching actuators based on optoelectric sensors, a distinction between passive and active sensors can be made. In passive sensors, only a photodetector sensitive to temperature or a radiating element is used, while active sensors comprise a light emitter element and a photo-sensitive receiver element. According to the latter arrangement, the light emitter element emits light, and the receiver element detects the light that is emitted by the emitter element as it is received upon reflection by an object. Active sensors have the advantage to be independent to varying ambient light conditions. Optoelectric sensors allow creating proximity sensors that operate without contact. Examples of active optoelectric sensors can be found in patent-literature documents US2002/002080 A1 and US2010/0060611 A1. An example of an optoelectric switch as described by US2002/002080 A1 is shown in FIG. 1. The optoelectric switch comprises an emitter element 81 which emits a light beam 86, and further comprises a photosensitive receiver element 82, which detects the light beam 86 that is reflected by the presence of an object. Emitter element 81 and receiver element 82 are mounted on a substrate 83. This optoelectric switch further comprises an actuating surface 84 that is transparent in order to let the light emitted by the emitter element 81 pass through. The actuating surface 84 allows reflection of the light emitted by emitter element 81 if it is touched or approached with an object, such as a finger F. As light from emitter 81 is reflected by the object, it is received by receiver element 82, which converts the light into an electrical current. Associated electronic circuitry completes the arrangement to provide an electronic switch function using the devices 81 and 82. US2010/00606011 A1 discloses a touch display of similar principle, using multiple light sensors for detection of touch position in a touch-sensitive LCD display.

However, these prior art arrangements have several disadvantages. One of these disadvantages is that they require a special arrangement with dedicated components such as the emitter element 81 and the receiver element 82. Another disadvantage is that the required special arrangement occupies space on the surface of the device that implements the optoelectric switch, that comes in addition to space needed for other components, such as light emitting elements that indicate an operating function of the device, and one or more additional receiver elements for reception of remote control commands.

Commercial pressure is continuously pushing to improve the ability to cost-efficiently produce similar versions of a same device with different functionalities, and to provide more functions with fewer components. There is thus a need for further optimization of prior art solutions.

3. SUMMARY OF THE INVENTION

The present invention aims at alleviating some inconveniences of prior art.

To this end, the invention comprises a device, comprising an indicator element capable of emitting electromagnetic radiation for providing a first function of indication to a user of an operating state of a function of the device; a receiver element capable of receiving invisible electromagnetic radiation from a remote control device for providing a second function of reception of remote control commands; the device further comprising means for combining the indicator element and the receiver element to provide a third function of touch sensor for local operating of functions of the device, the indicator element emitting, during a first period of time, a pattern of electromagnetic radiation that, when received during the first period of time by the receiver element through reflection by an object, triggers a state change of an operating function of the device, the indicator element providing the first function during a subsequent second period of time and the receiver element providing the second function during the second period of time, the first and the second period of time being repeatedly alternated.

According to a variant embodiment the indicator element provides the indication in a visible red light spectrum.

According to a variant embodiment the indicator element provides the indication in a visible green light spectrum.

According to a variant embodiment the invisible electromagnetic radiation is infra red light.

According to a variant embodiment the first period of time is shorter than 20 milliseconds so that the indication of the operating state is continuous to the user due to persistence of human vision when the first and the second period are being repeatedly alternated.

According to a variant embodiment the indicator element emits electromagnetic radiation for indicating an operating state of a function of the device to the user during the second period of time.

According to a variant embodiment the indicator element does not emit electromagnetic radiation for indicating an operating state of a function of the device to the user during the second period of time.

According to a variant embodiment the pattern is modulated at a frequency used by the remote control.

According to a variant embodiment the pattern is comprised of pulses, each of the pulses having a pulse width that does not exceed 1 millisecond in duration.

The current invention also comprises a method for providing a touch sensor function for operation of functions of a device, the device comprising an indicator element capable of emitting electromagnetic radiation for a first function of indication to a user of an operating state of a function of the device, and a receiver element capable of receiving invisible electromagnetic radiation from a remote control for a second function of reception of remote control commands, the method further comprising steps of providing the first and the second function during a first period of time by the indicator element and the receiver element; the indicator element and the receiver element providing the touch sensor function during a subsequent second period of time; the first and the second period being repeatedly alternated, the indicator element emitting, during the first period of time, a pattern of electromagnetic radiation that, when received during the first period of time by the receiver element through reflection by an object, triggers a state change of an operating function of the device.

According to a variant of the method of the invention, the invisible electromagnetic radiation is infra red light.

According to a variant of the method of the invention, the first period of time is shorter than 20 milliseconds so that the indication of the operating state is continuous to the user due to persistence of human vision when the first and the second period are being repeatedly alternated.

According to a variant of the method of the invention, the indicator element emits electromagnetic radiation for indicating an operating state of a function of the device to the user during the second period of time.

According to a variant of the method of the invention, the indicator element does not emit electromagnetic radiation for indicating an operating state of a function of the device to the user during the second period of time.

According to a variant of the method of the invention, the pattern is modulated at a frequency used by the remote control.

According to a variant of the method of the invention, the pattern is comprised of pulses, each of the pulses having a pulse width that does not exceed 1 millisecond in duration.

4. LIST OF FIGURES

More advantages of the invention will appear through the description of particular, non-restricting embodiments of the invention. The embodiments will be described with reference to the following figures.

5. DETAILED DESCRIPTION OF THE INVENTION

Figure 1:
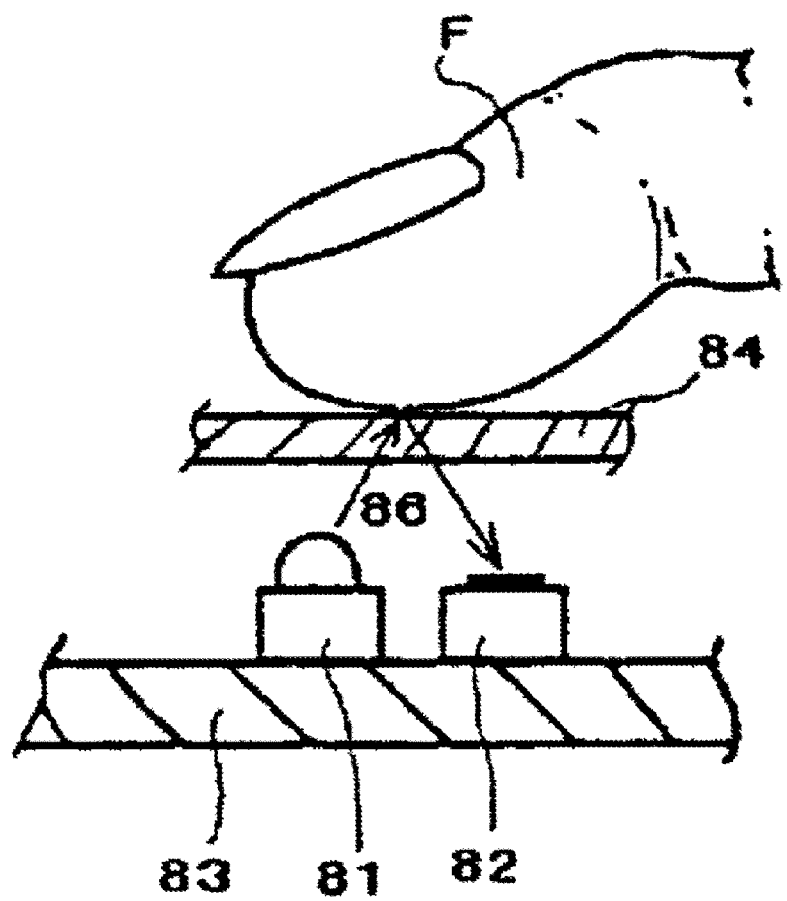
FIG. 1 is a typical prior-art arrangement of an optoelectric switch that has already been discussed previously in the technical background section of this document.

FIG. 1 is a typical prior-art arrangement of an optoelectric switch that has already been discussed previously in the technical background section of this document. Other arrangements are possible where emitter element 81 and receiver element 82 are not mounted on a substrate 83, but are directly fixed to actuating surface 84. If elements 81 and 82 are fixed into the actuating surface so as to be level with it, the actuating surface does not need to be transparent. Finger F in the figure is shown as touching the actuating surface. In practice, it can be sufficient to approach the surface to detect light in receiver element 82 by reflection of the light that is emitted by emitter element 81. If a switchover state is detected upon touch or approach is a fine tuning parameter of the arrangement, the difference can be made through the amplitude of the reflected light received by receiver element 82.

Figure 2:
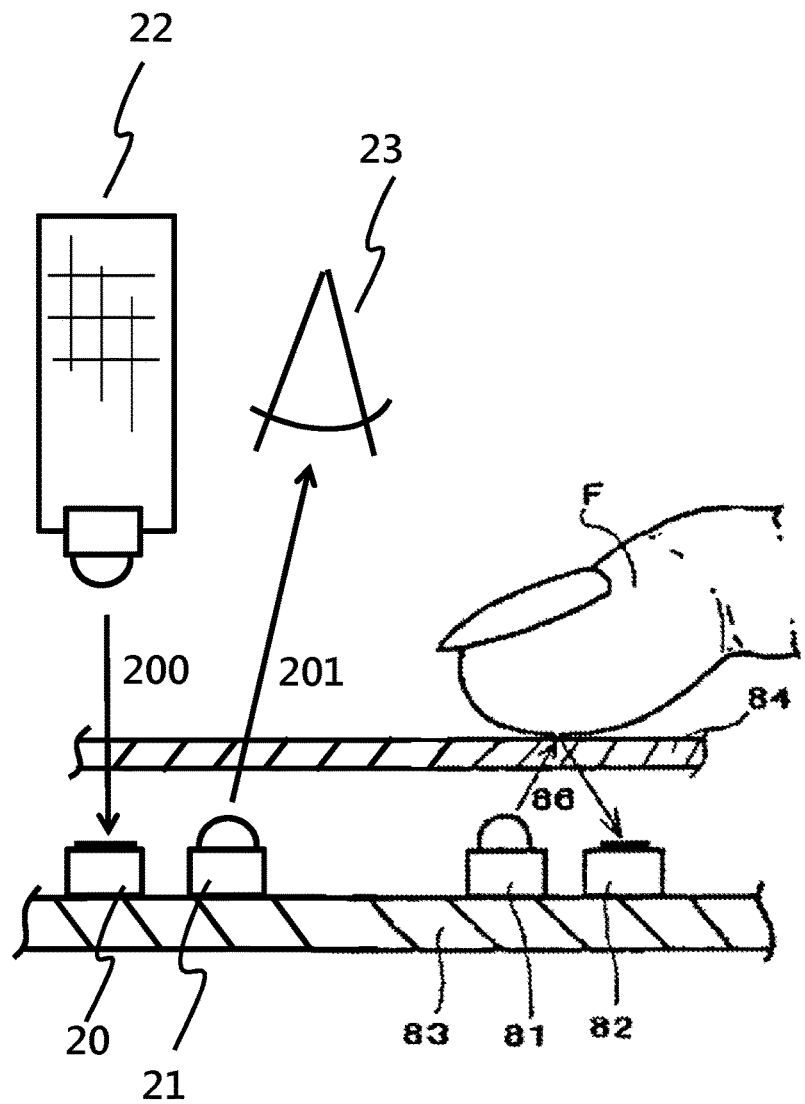
FIG. 2 is a typical prior-art arrangement as depicted in FIG. 1 with additional remote control receiver element and power-on indicator.

FIG. 2 is a typical prior-art arrangement as depicted in FIG. 1 with additional remote control receiver element and power-on indicator. In this arrangement, an additional remote control receiver element 20 is mounted on the substrate 83. The remote control receiver element 20 is receptive to light in the infrared spectrum, emitted by remote control device 22 for detection of infrared light pulses from the remote control, allowing a user to remotely transmit commands to the device implementing the arrangement. An additional power-on light emitting device 21, such as a Light Emitting Diode or LED, indicates the power on state of the device to which the arrangement corresponds, which light can be detected by the eye 23 of a user. As can be observed, there are two light emitting elements (81 and 21) in this arrangement, and two light receiving elements (82 and 20). These elements are necessary for providing the functions of:

- remote control command reception,
- power-on state indication, and
- optoelectric switching or touch sensing.

Figure 3:
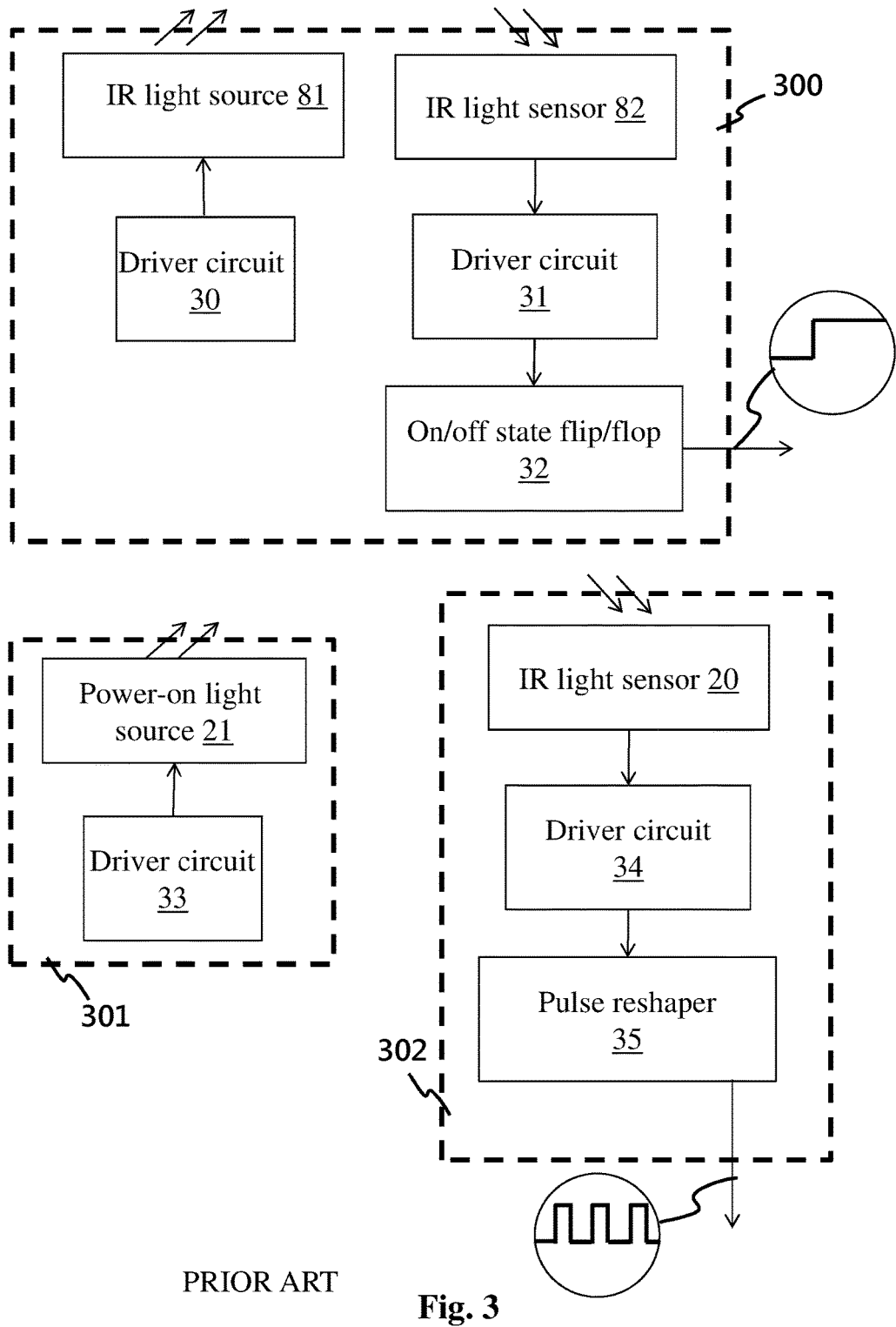
FIG. 3 is a block diagram of the prior-art arrangement of FIG. 2 with associated hardware circuits.

Each of these three functions comes with dedicated associated electronic circuitry (shown in FIG. 3). Each of the tree functions are implemented separately. There is no synergy and this solution is not optimized.

FIG. 3 is a block diagram of the prior-art arrangement of FIG. 2 with associated circuits, as can be found in a prior art device. Block 300 represents circuits needed for providing a function of touch sensor. Block 301 represents circuits needed to provide a function of an indicator for giving a visible indication to a user of an operating state of a function of the device. Block 302 represents circuits needed for a receiver element capable of receiving invisible electromagnetic radiation from a remote control device, for providing of a function of reception of remote control commands.

Block 300 comprises an infrared light source 81, a driver circuit 30 for the infrared light source, an infrared light sensor 82, a driver circuit for reception of signals from the infrared light sensor, typically comprising an amplifier with Automatic Gain Control, and an on/off state flip-flop which output allows to switch on or off a function of the device. Block 301 comprises an emitter element 81 and a driver circuit 33. Block 302 comprises an IR light sensor 20, a driver circuit 34 and a pulse reshaper 35. The latter reshapes the raw pulse forms received from the driver 34, so that the pulse form is ready to be interpreted for determining to which remote control command a pulse form corresponds to.

Figure 4:
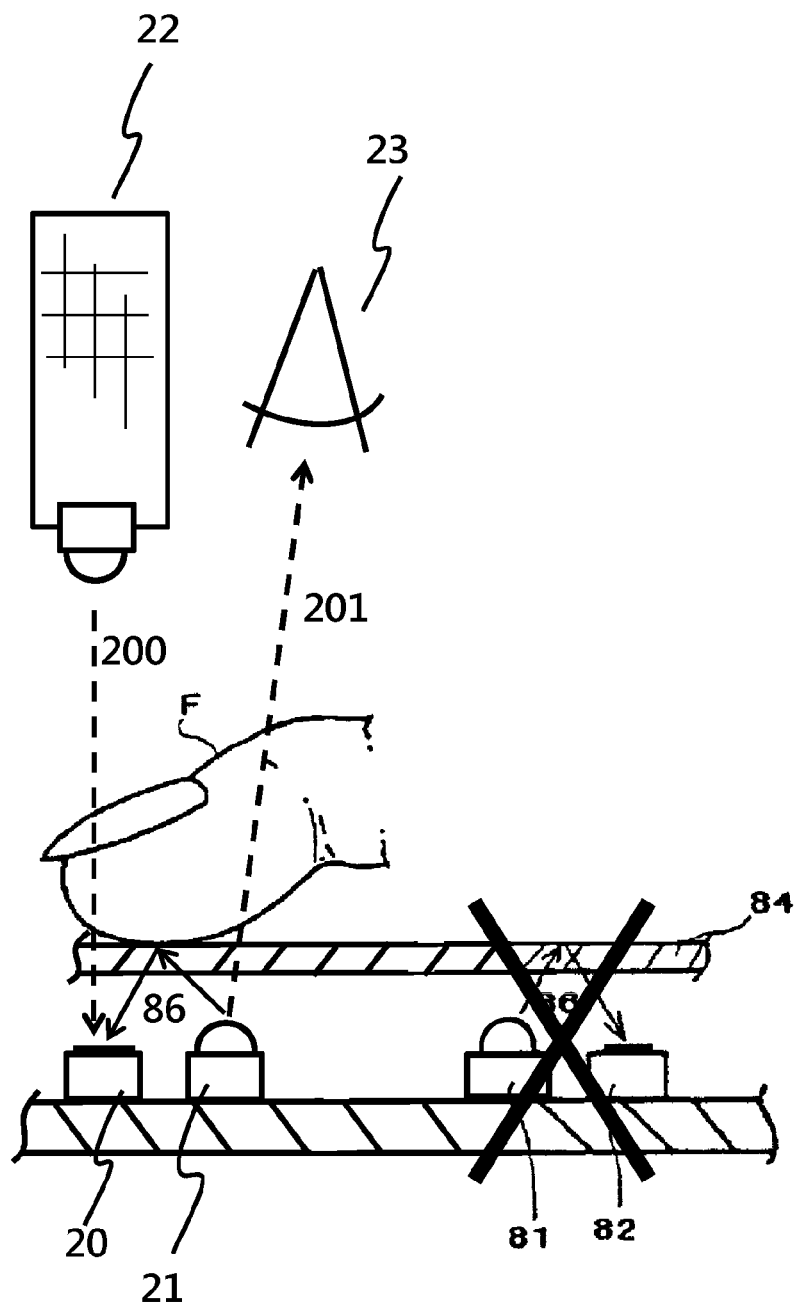
FIG. 4 shows a non-limiting example embodiment of an arrangement according to the invention.

FIG. 4 is a non-limiting example embodiment of an arrangement according to the invention. Here, the three functions—remote control receiver, power-on indicator, and optoelectric switch/touch sensor—are provided by using only two optoelectric elements: infrared receiver 20 and power-on emitter 21. As can be observed, the barred elements—infrared transmitter 81, and infrared receiver 82—are no longer needed. Due to the relative proximity of the power-on indicator element 21 and the infrared remote control receiver element 20, the infrared receiver element receives some light emitted by the power-on indicator element 21. While the power-on indicator element 21 is designed to emit light in the visible wavelength, it also emits some 'spurious' light of low amplitude in a wavelength that can be detected by the infrared receiver element 20 (FIG. 6 will further illustrates this phenomena). The user's finger F that approaches a zone in front of the infrared receiver element 20/power-on indicator 21, will reflect the 'spurious' infrared light emitted by the power-on indicator that is received by the infrared receiver element 20. The wavelength of visible light has a spectral distribution of 490-540 nm for green light, 600-650 nm for orange light, and 650-700 nm for red light. Infrared light has longer wavelength than visible light, namely from 780-1060 nm. Typical infrared wavelength for remote control devices is around 940 nm. A typical red power-on LED also emits some infrared light that overlaps with the spectrum of sensitivity of a typical infrared remote control receiver diode as can be seen according to FIG. 6. The infrared receiver element 20 and the power-on indicator 21 can thus be used to provide a function of an optoelectric switch. But for these elements to continue to provide their original functions—remote control command reception and power-on state indication, a special arrangement is needed. Such special arrangement is discussed with the help of FIGS. 5 and 6.

Figure 5:
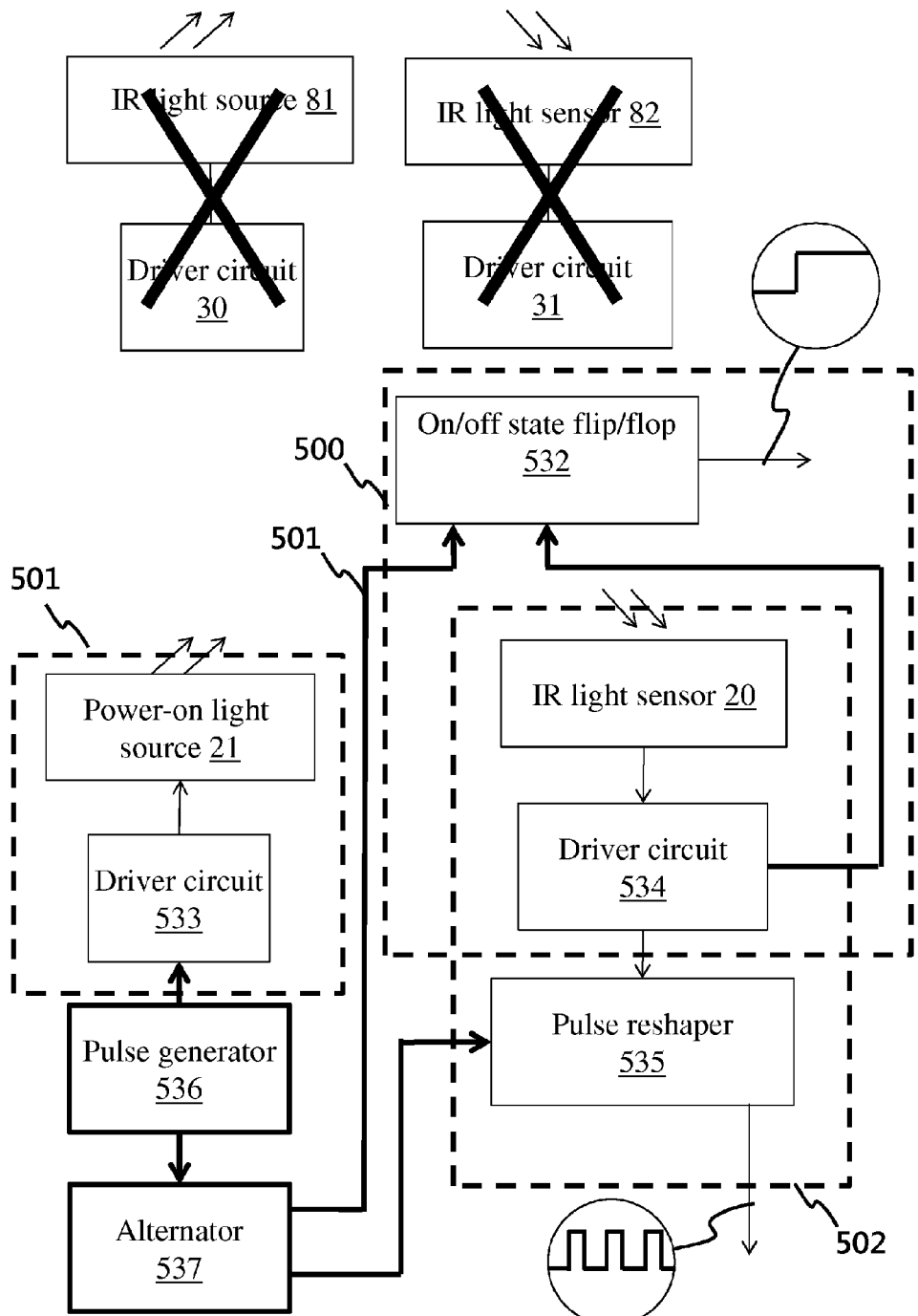
FIG. 5 is a block diagram of a non-limiting embodiment of the invention according to the arrangement of FIG. 4.
Figure 6:
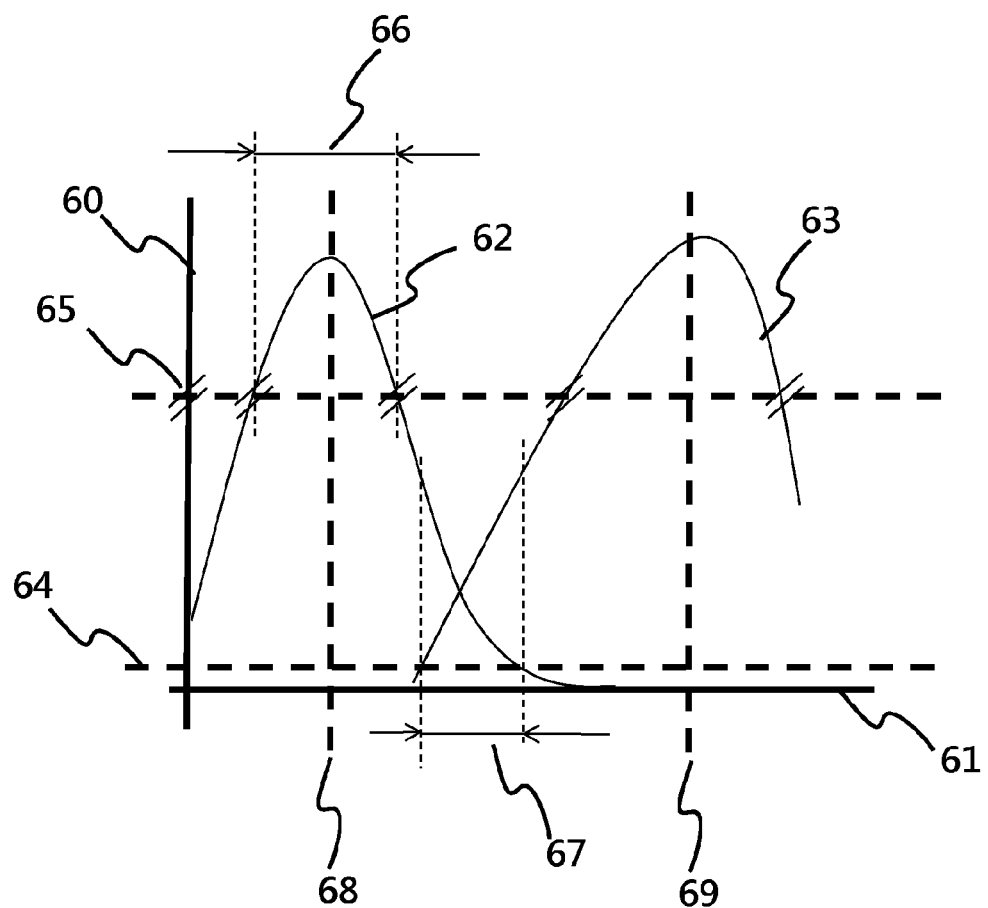
FIG. 6 is a spectral distribution of a LED emitting visible light, superposed with a spectral distribution of an infrared receiver diode.

FIG. 5 is a block diagram of a non-limiting embodiment of the invention according to the arrangement of FIG. 4.

Comparing prior-art FIG. 3 with FIG. 5, it can be observed that IR light source 81, driver circuit 30, IR light sensor 82 and driver circuit 31 are no longer needed, due to the reuse of elements and circuits, to provide a third function of a touch sensor. Pulse generator 36 provides pulses destined for reception by the IR light sensor 20 for providing the third function of touch sensor or optoelectric switch. Alternator 537 switches the output of the IR light sensor 20 to either the pulse reshaper 535, for providing the second function of reception of remote control commands, or to the on/off state flip flop 532, for providing the third function of touch sensor/optoelectric switch function. The Alternator is driven with a signal from pulse generator 536, making it alternatively enabling the on/off state flip flop 532 or the pulse reshaper 535.

FIG. 6 is a spectral distribution of a LED emitting light, superposed with a spectral distribution of an infrared receiver diode.

60 represents the Y-axis or amplitude. 61 represents the X-axis or wavelength. 62 represents the emission spectrum curve of a typical LED emitting in the visible spectrum. 63 represents a spectral receptivity curve of a typical IR receiver. 68 represents the median of curve 62 (e.g., 675 nm), and 69 that of curve 63 (e.g., 940 nm). 64 represents a minimal detection amplitude for detecting infrared pulsed light using the IR receiver. 67 represents a zone in which light emitted by the LED can be detected by the IR receiver. 66 represents a typical width of light spectrum emitted by a LED as depicted in a data sheet (typically 20 nm).

In typical data sheets of LEDs and IR receivers, the Y-axis 60 is represented on a linear scale, because the main interest of electronic design engineers is focused on the median. Using such linear presentation, the lower part of the amplitude of light emission is represented as a fairly vertical line. However, in the low-amplitude zone (illustrated in FIG. 6 as being under dotted line 65) that is considered as being not detectable by the human eye, the curves do overlap. As the IR receiver has a very high sensitivity, it is thus possible for the IR receiver to detect light emitted by the LED in the zone 67. Surprisingly, the low amplitude of the light emitted by the LED that falls in the zone 67 is sufficiently important to be detected by the IR receiver, the IR receiver being designed to receive light from a remote control at a distance of some meters; the IR receiver is thus suited to detect IR light of this low amplitude. In the present invention, these features are advantageously taken into account and exploited.

According to an optimization of the current invention, the sensitivity of the arrangement is optimized by taking into account the characteristics of the Automatic Gain Control circuit that controls the gain of the IR receiver and that protects it against perturbations due to the presence of ambient light or of artificial light sources. Indeed, the AGC circuit allows the IR receiver, that is designed to receive short infrared light pulses from an IR remote control to be tolerant to infrared 'noise'. The pulses of the IR transmitter of the IR remote control are sufficiently short for the AGC to remain activated (typically 1 ms) and thus to provide considerable gain. However, the above mentioned 'noise' has a characteristic to have typically a longer duration than the pulses received from a remote control, and thus the AGC is designed to reduce the gain if the duration exceeds the duration of the pulses expected from an IR transmitter from a remote control. The duration of a light pulse that leads the AGC to reduce the gain, is referred herein as AGC reaction delay. The invention exploits this characteristic of the AGC, by providing a pattern of light pulses of which the duration of each pulse does not exceed the AGC reaction delay, so that the gain is kept on a high level.

Figure 7:
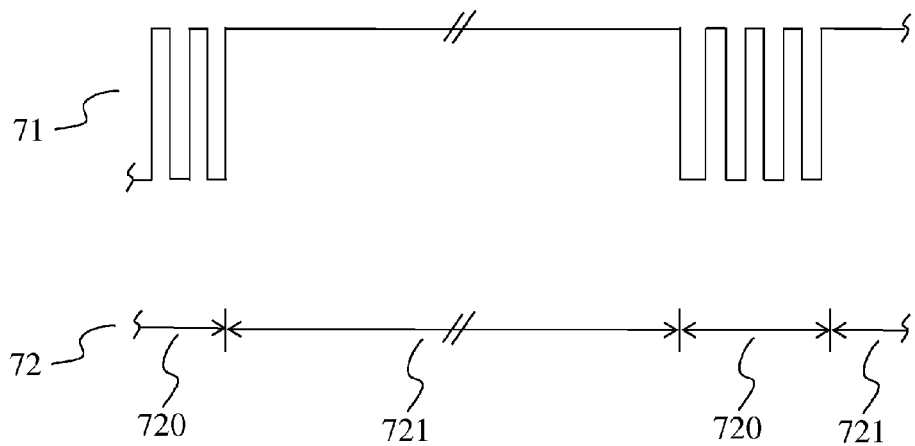
FIGS. 7 and 8 are non-limiting example embodiments of temporal distribution of signals according to the invention.
Figure 8:
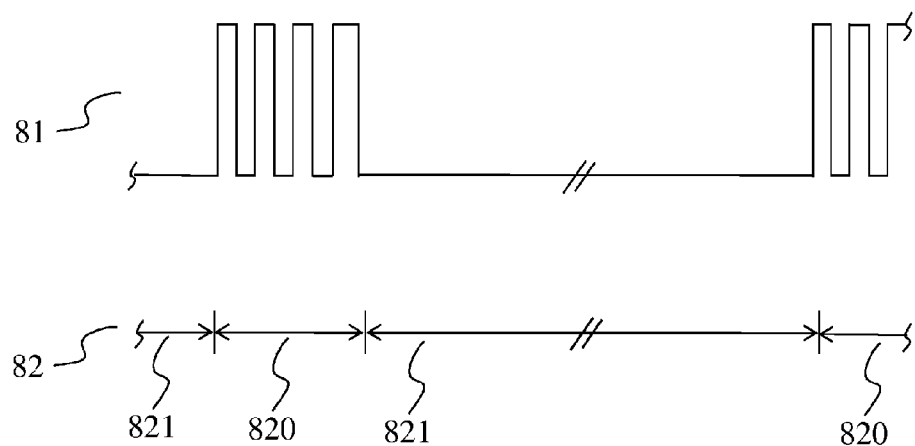

FIGS. 7 and 8 are non-limiting example embodiments of temporal distribution of signals according to the invention. In particular, FIG. 7 shows the emission of light by the power-on indicator 21 according to the invention, the power-on indicator 21 indicating a visible 'on' state. FIG. 8 shows the emission of light by the power-on indicator 21 according to the invention when the power-on indicator 21 indicates a visible 'off' state. FIG. 7 shows that according to the invention, the emission of power-on indicator 21 is divided in periods in which the power-on indicator 21 is continuously on (periods 721), and quickly switched from the on to the off state (periods 720). The distribution of periods 721 and 720 is chosen such that the periods 720 are sufficiently short to not be detectable by the human eye 23. Taking into account the persistence of human vision, the periods 720 are preferably shorter than 20 ms. In other words, the periods 720 are shorter than 20 milliseconds so that the indication of the operating state is continuous to the user due to persistence of human vision, reminding that the first and the second period are being repeatedly alternated. Periods 720 are then used to transmit light pulses that are destined to be detected by the infrared receiver 20 when the light pulses are reflected by an object in proximity such as finger F. Detection of a presence of a reflecting object such as finger F is detected if a predetermined number of pulses are received. While the present invention can be used when the power-on indicator emits light to indicate an 'off' state to the user (for example, red or orange light), the present invention can also be used when the power-on indicator 21 emits no light to indicate an 'off' state. The periods 720 being shorter than 20 milliseconds, the indication of the operating state is continuous to the user due to persistence of human vision.

During periods 721 or 821, the infrared receiver 20 is used for the function of detection of commands from the infrared remote control 22. The arrangement thus alternates the use of infrared receiver 20 between detection of pulses from the power-on indicator 21 during periods 720/820 for detection of a button operation, and detection of pulses from the remote control 22 during periods 721/821. This alternation is for example operated by alternator 537 of FIG. 5. For the remote control command detection, this alternation avoids interference during periods 720/820 between reception of pulses from the power-on indicator 21 and pulses received from remote control 22, the detection of remote control commands being disabled during periods 720/820. Such short interruption of detection of commands from the remote control is not harmful to the reception of remote control commands, since a typical button press on a remote control takes at least one second, which largely spans over period 720/820 so that the remote control pulses will be received during the period 721/821 that follows. Further for the remote control command detection, interference with the reception of pulses of the remote control 22 through reception of pulses from the power-on indicator 21 during periods 721/821 is avoided because the power-on indicator 21 does not emit light pulses during these periods.

For the touch sensing by the optoelectric switch, any interference by reception of pulses from the remote control 22 during periods 720/820 that the present arrangement is open to reception of pulses from power-on indicator 21 is unlikely because if pulses are received from power-on indicator 21, the infrared receiver 20 will not receive any pulses from infrared remote control 22 since it is masked by finger F. If it does however, the pulses received from the remote control 22 and the power on indicator 21 will be mangled and the detection can easily be rejected by associated circuitry.

According to a variant embodiment of the current invention, the frequency of emission of the discussed light pulses is chosen to correspond to the frequency used by the remote control as the infrared receiver 20 is also used for the function of reception of infrared pulses from the remote control 22 (typically, 33, 36 or 38 kHz). This variant embodiment has the advantage to obtain maximum sensitivity for reception of the infrared pulses as the infrared receiver 20 circuitry is designed to reject pulses of frequencies that does not correspond to the infrared pulse frequency of the remote control 22 in order to reject 'noise', i.e. impulses from other light sources such as ambient light, fluorescent lamps, plasma or LCD screens. According to another variant embodiment, the present invention can be further optimized by triggering a detection of a presence of finger F only if the reception of light pulses is repeated over several periods. This has the advantage to avoid false detection.

According to the preceding example embodiments, a finger is given as a non-limiting example of a reflecting element. Alternative reflecting elements are for example a pencil, stylus or any other pointing device that sufficiently reflects light emitted by the power-on indicator to be detected by the infrared receiver element.

According to the preceding example embodiments, light in the visible (red, yellow, orange, green, . . . ) and in the invisible (infra red) spectrum is mentioned as a non-limiting example of electromagnetic radiation. Though this corresponds to spectral distribution of emitter/receiver elements that were commonly available at the time the invention was made, the skilled in the art will understand that this is a non-limiting example that does not exclude the use of other electromagnetic radiation spectra for realizing the invention. In particular, the arrangement of the invention is suited to be used with electromagnetic radiation that is not visible or invisible light, such as radio waves in the microwave range.

According to the preceding example embodiments, a power-on indicator is used to provide the function of power-on indication and as part of a function of touch sensor. Of course, it is not necessary that the emitting element is a power-on indicator; according to a variant embodiment, the emitting element is a status indicator, having a function of indicating to a user an operating state of a function of the device implementing the arrangement of the invention.

Although described embodiments discuss the use of electronic circuits, some described functions that are presented as being implemented by dedicated electronic circuits may instead be implemented as software to further reduce production costs of the device implementing the present arrangement.

Alternatively, the invention is implemented using a mix of hard- and software components, where dedicated hardware components provide functions that are alternatively executed in software. According to a particular embodiment, the invention is entirely implemented in hardware, for example as a dedicated component (for example as an ASIC, FPGA or VLSI) (respectively <<Application Specific Integrated Circuit>>, <<Field-Programmable Gate Array>> and <<Very Large Scale Integration>>) or as distinct electronic components integrated in a device or in a form of a mix of hardware and software.

The invention claimed is:

1. A device, wherein the device comprises:
an indicator element capable of emitting electromagnetic radiation for providing a first function of indicating an operating state of a function of the device;
a receiver element capable of receiving invisible electromagnetic radiation from a remote control device for providing a second function of reception of remote control commands;
the indicator element and the receiver element are configured to provide a third function of touch sensor for local operating of functions of the device, the indicator element emitting, during a first period of time, an electromagnetic radiation pattern modulated at a frequency used by the remote control that, when received during the first period of time by the receiver element through reflection by an object, triggers a state change of an operating function of the device, during a subsequent second period of time the receiver element providing the second function and the indication of the operating state by the indicator element appears continuous when the emitting by the indicator element is repeated during each occurrence of the second period of time, the first period of time and the second period of time being repeatedly alternated.

2. The device according to claim 1, wherein the indicator element is further configured to provide the indication in a visible red light spectrum.

3. The device according to claim 1, wherein the indicator element is further configured to provide the indication in a visible green light spectrum.

4. The device according to claim 1, wherein the invisible electromagnetic radiation is infra red light.

5. The device according to claim 1, wherein the first period of time is shorter than 20 milliseconds so that the indication of the operating state is continuous to a user of the device due to persistence of human vision when the emitting by the indicator element is repeated during each occurrence of the second period of time.

6. The device according to claim 1, wherein the indicator element is configured to emit electromagnetic radiation for indicating an operating state of a function of the device during the second period of time.

7. The device according to claim 1, wherein the indicator element is further configured to not emit electromagnetic radiation for indicating an operating state of a function of the device during the second period of time.

8. The device according to claim 1, wherein the pattern is comprised of pulses, each of said pulses having a pulse width that does not exceed 1 millisecond in duration.

9. A method for providing a touch sensor function for operation of functions of a device, the device comprising an indicator element capable of emitting electromagnetic radiation for a first function of indication of an operating state of a function of the device, and a receiver element capable of receiving invisible electromagnetic radiation from a remote control for a second function of reception of remote control commands, said method comprising:

the indicator element providing the first function and the receiver element providing the second function during a first period of time;

the indicator element and the receiver element providing the touch sensor function during a subsequent second period of time;

the first period of time and the second period of time being repeatedly alternated, the indicator element emitting, during the second period of time, an electromagnetic radiation pattern modulated at a frequency used by the remote control that, when received during the second period of time by the receiver element through reflection by an object, triggers a state change of an operating function of the device and the indication of the operating state by the indicator element appears continuous when the emitting by the indicator element is repeated during each occurrence of the first period of time.

10. The method according to claim 9, wherein the second period of time is shorter than 20 milliseconds so that the indication of the operating state is continuous to a user of the device due to persistence of human vision when the emitting by the indicator element is repeated during each occurrence of the first period of time.

11. The method according to claim 9, wherein the indicator element emits electromagnetic radiation for indicating an operating state of a function of the device during the first period of time.

12. The method according to claim 9, wherein the indicator element does not emit electromagnetic radiation for indicating an operating state of a function of the device during the first period of time.

13. The method according to claim 9, wherein the pattern is comprised of pulses, each of said pulses having a pulse width that does not exceed 1 millisecond in duration.

* * * * *

UNITED STATES PATENT AND TRADEMARK OFFICE
CERTIFICATE OF CORRECTION

PATENT NO.        : 9,691,269 B2
APPLICATION NO.   : 14/432792
DATED             : June 27, 2017
INVENTOR(S)       : Jean-Marie Steyer and Gerard Morizot It is certified that error appears in the above-identified patent and that said Letters Patent is hereby corrected as shown below:

On the Title Page

Please amend Applicant address as follows:
(71) Applicant: THOMSON LICENSING, Issy les Moulineaux (FR)

Signed and Sealed this
Twelfth Day of July, 2022

Katherine Kelly Vidal
*Director of the United States Patent and Trademark Office*